United States Patent [19]

Takemae et al.

[11] Patent Number: 4,787,067

[45] Date of Patent: Nov. 22, 1988

[54] SEMICONDUCTOR DYNAMIC MEMORY DEVICE HAVING IMPROVED REFRESHING

[75] Inventors: Yoshihiro Takemae, Tokyo; Masao Nakano, Kawasaki; Kimiaki Sato, Tokyo; Nobumi Kodama, Kawasaki, all of Japan

[73] Assignee: Fujitsu Limited, Kawasaki, Japan

[21] Appl. No.: 883,804

[22] Filed: Jul. 9, 1986

[30] Foreign Application Priority Data

Jul. 10, 1985 [JP] Japan .................. 60-150094

[51] Int. Cl.$^4$ .......................... G11C 8/00; G11C 7/00
[52] U.S. Cl. ................................. 365/222; 365/230
[58] Field of Search .............. 365/222, 189, 233, 230

[56] References Cited

U.S. PATENT DOCUMENTS

| 4,079,462 | 3/1978 | Koo | 365/189 |
| 4,646,272 | 2/1987 | Takasugi | 365/233 |
| 4,653,030 | 3/1987 | Tachibana et al. | 365/222 |

FOREIGN PATENT DOCUMENTS

| 0147193 | 9/1982 | Japan | 365/222 |
| 2127596 | 4/1984 | United Kingdom | 365/233 |

Primary Examiner—Stuart N. Hecker
Assistant Examiner—Glenn A. Gossage
Attorney, Agent, or Firm—Armstrong, Nikaido, Marmelstein & Kubovcik

[57] ABSTRACT

A semiconductor dynamic memory device having an improved refreshing time is disclosed wherein the memory device provides two buffer memories exclusively for the external and refresh addresses, each of the buffer memories comprising a preamplifier and a driver stage. When the falling edge of a $\overline{RAS}$ signal is detected, all the circuits are enabled in parallel, but the operation of the driver is suppressed. As soon as a $\overline{CAS}$ before $\overline{RAS}$ detector discriminates which of the falling edges of the $\overline{CAS}$ and $\overline{RAS}$ signals becomes low earlier, it sends an address driving signal to one of the drivers, and the external address or refresh address are sent immediately. Using this technique, the prior art sequential operation of discriminating the falling edges of $\overline{RAS}$ and $\overline{CAS}$ signal, sending the refresh signal, receiving it and switching the circuit from external address to refresh address is eliminated, and is replaced by a parallel operation. Thus the set up time of the dynamic memory is reduced to 1-2 n.sec. by the present invention.

7 Claims, 6 Drawing Sheets

SEMICONDUCTOR DYNAMIC MEMORY DEVICE HAVING IMPROVED REFRESHING

BACKGROUND OF THE INVENTION

This invention relates to an improvement in a dynamic memory device to reduce its set up time, and to reduce the access time or cycle time of the system employing the memory device.

Among various memory devices used for various kinds of computers or data processing devices, dynamic memory devices especially semiconductor dynamic memory devices are most widely used because of their low cost and stable operation. In order to improve the operation speed of the computers or data processing systems, it is necessary to reduce the access time of the memory device.

A dynamic memory cell must be refreshed periodically to retain its data. Initially, refreshing was done by selecting word lines with an external circuit like the manner of reading data in the memory device. But such an external refreshing method is not easy especially for a large scale memory device, so recently the refreshing has been changed to an internal refreshing method which refreshes the memory cells corresponding to the address generated by an internal address counter.

In such a case, the memory device has to recognize or distinguish a state indicating whether it is required to refresh the stored data or it is required to access the data stored in its memory cells. Such recognition is usually done by discriminating the falling edge of a column address strobe bar signal (CAS bar signal, denoted by $\overline{CAS}$) and a row address strobe bar signal (RAS bar signal, denoted by $\overline{RAS}$). In particular, if the falling edge of the $\overline{CAS}$ signal is detected before that of the $\overline{RAS}$ signal, then the memory device recognizes that refreshing should be done, but if the falling edge of the $\overline{CAS}$ signal is detected after the falling edge of the $\overline{RAS}$ signal, the memory device recognizes that it should access the stored data.

Normally, a dynamic memory device is sending or receiving data between its memory cells and external circuits. Thus, reading or writing in the memory is its normal operation. Such operation (usually called as access operation) is controlled by $\overline{CAS}$ and $\overline{RAS}$ signals. But during such operation, it also refreshes the data stored in it. The switching of operations is done by advancing or delaying the falling edge of the $\overline{CAS}$ or $\overline{RAS}$ signals. These control signals are supplied to the memory device from external circuits. Since the memory devices are fabricated as an IC (integrated circuit) and packed in a single package, these signals are supplied to respective contact pins of the IC.

Figure 1:
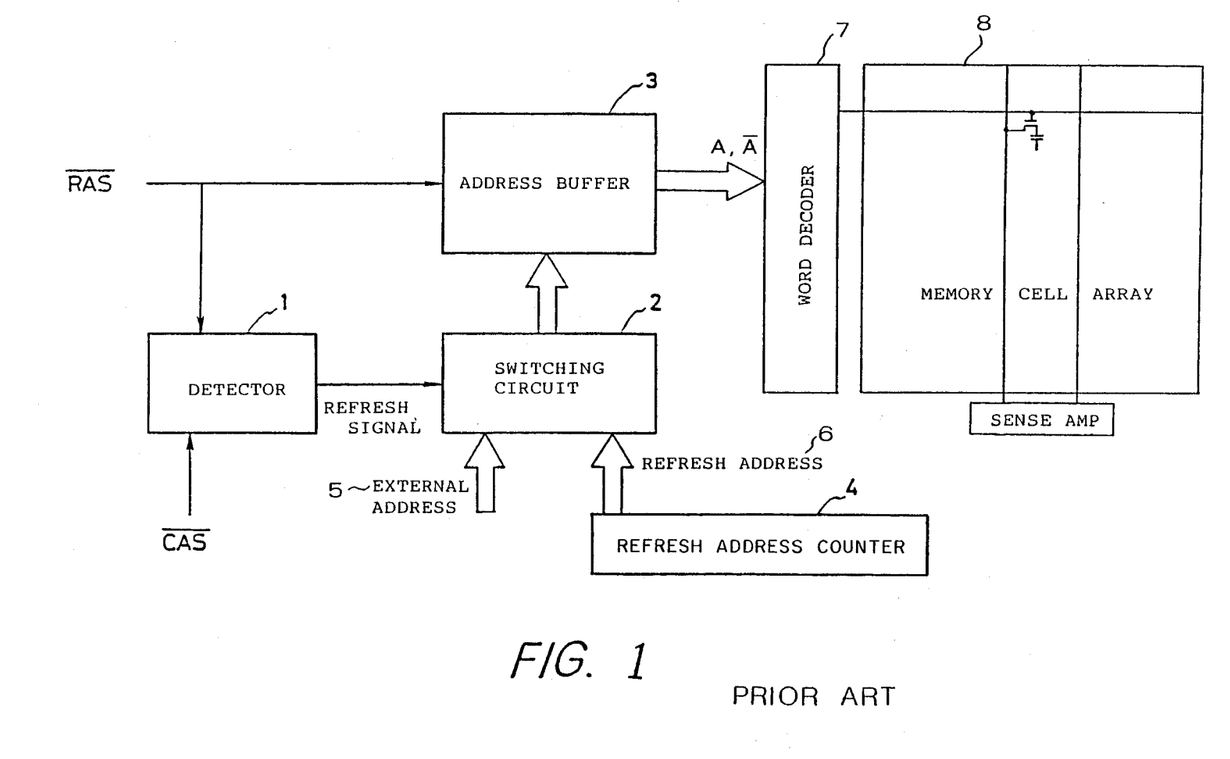
FIG. 1 is a block diagram showing a circuit configuration of prior art semiconductor dynamic memory device.

The refreshing and access operations of a prior art memory device and its problem will be described briefly referring to FIGS. 1 and 2. FIG. 1 is a block diagram to explain the refresh or access operation of a dynamic memory device. In the figure, a detector 1 detects the falling edges of $\overline{CAS}$ and $\overline{RAS}$ signals, and discriminates which falling edge of these signals have been detected earlier. The detector 1 sends a refresh signal to a switching circuit 2 when it detects the falling edge of the $\overline{CAS}$ before that of $\overline{RAS}$ signal. Therefore, it is called as a $\overline{CAS}$ before $\overline{RAS}$ detector.

The switching circuit 2 is supplied an external address 5 and a refresh address 6 which is generated by a refresh address counter 4. The external address 5 is an address of the memory cell in which new data should be read out or rewritten. The external address 5 is supplied through a contact pin of the memory IC. Normally, the switching circuit 2 is switched to the external address signal supplied from an external circuit and sends the signal to an address buffer 3. But when the switching circuit 2 receives the refresh signal, it switches to the refresh address counter 4 to send a refresh address 6 to the address buffer 3.

The address buffer 3 latches the address signals sent from the switching circuit 2, and sends them successively to a word decoder 7. The word decoder selects word lines corresponding to the address signal, and accesses the data in the corresponding memory cells in a memory cell array 8. Since the processes such as decoding and storing the data and reading out the data are conventional and they are not explicitly relevant to the present invention, further description of these processes is omitted.

In a normal access operation, the $\overline{CAS}$ signal is controlled to become low level after the $\overline{RAS}$ signal becomes low level L. Therefore, normally the external address is received so that data is stored in or read out from the memory cells, but when the falling edge of the $\overline{CAS}$ is shifted to go down before $\overline{RAS}$, the refresh signal is sent from the detector 1, and the switching circuit 2 sends a refresh address to the address buffer 3, so the stored data is refreshed.

Figure 2:
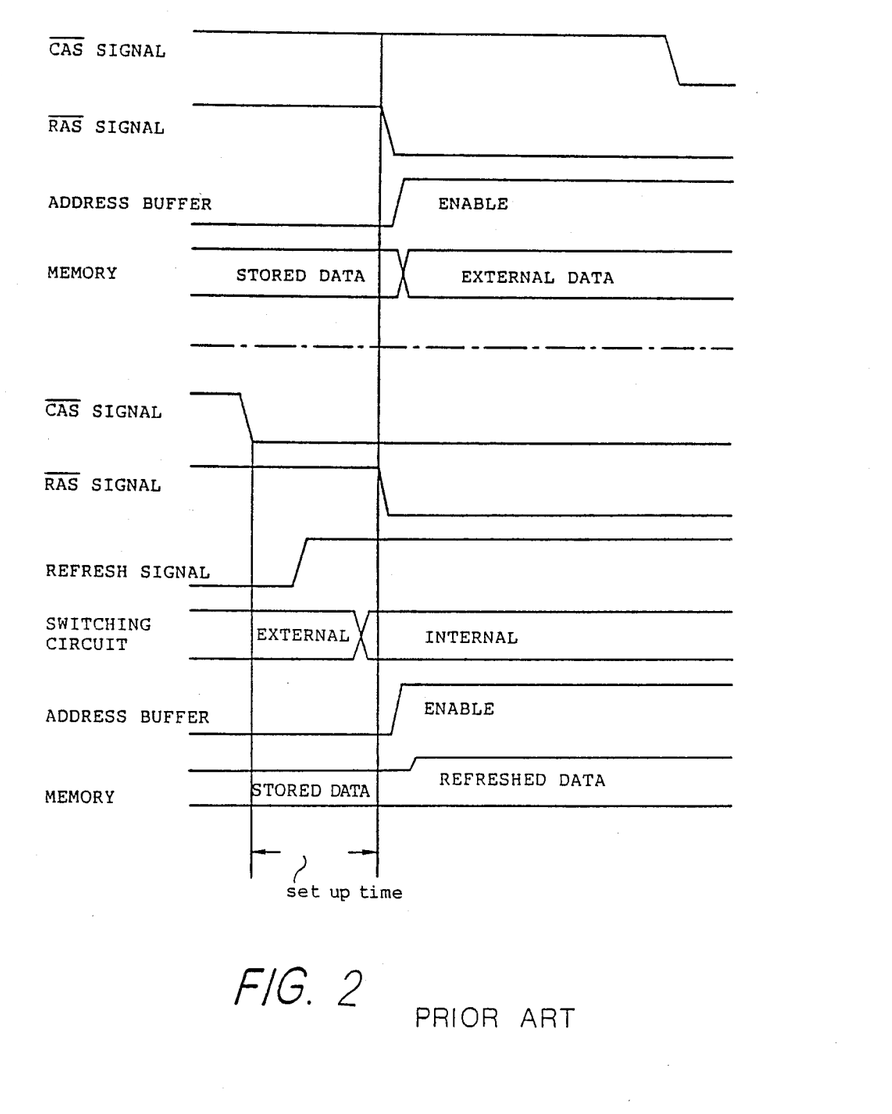
FIG. 2 is a time circuit illustrating the operation-time relation between various parts of the circuit of FIG. 1.

FIG. 2 is a time chart illustrating the operation timing of various points in the circuit of FIG. 1. In the figure, lines above a dashed line show a time relation for normal operation, namely the external address is received, and the lines below the dashed line show a time relation for the refresh operation.

In normal access operation, the $\overline{CAS}$ signal is at H level, so the detector 1 does not send the refresh signal, and the switching circuit 2 is switched to an external address. When the $\overline{RAS}$ signal becomes L, it is detected by the address buffer 3, and the address buffer 3 becomes enabled. Then, the external address is latched into the buffer address 3, and is successively sent to a word decoder 7, as address signal A and $\overline{A}$. Thus, the data is accessed in the memory array 8. This means the stored data has been accessed.

When it is time for refreshing, as shown by the lines below a dashed line in FIG. 2, timing of the $\overline{CAS}$ signal is shifted to become L level before the $\overline{RAS}$ signal is pulled down to L level. Such shifting is done by a shift of a clock pulse or using a delay circuit. This is detected by the detector 1 (which is a $\overline{CAS}$ before $\overline{RAS}$ detector), and it sends a refresh signal to the switching circuit. The switching circuit 2 switches the flow of data from external to internal, that is from the external address to a refresh address. Then the $\overline{RAS}$ signal is pulled down, and the address buffer 3 becomes enabled, so the refresh address is sent to the word decoder and the stored data is refreshed.

As has been described above and as can be seen in FIG. 2, in order to start up the refreshing process in the prior art circuit, it is necessary to pull down the $\overline{CAS}$ signal, before the $\overline{RAS}$ signal becomes L. The time between the falling edge of the $\overline{CAS}$ signal and that of the $\overline{RAS}$ signal is called a set up time. The set up time should be as short as possible in order to make the access time of the memory system short. Most of the set up time is consumed in detecting the $\overline{CAS}$ before $\overline{RAS}$, sending a refresh signal, receiving the refresh signal and switching the switching circuit. All these processes occur in sequence, so it is impossible to reduce the set up time to less than approximately 20-30 n.sec. using the present-state-of-the-art technology.

Moreover, in usual semiconductor dynamic memory devices, the normal operation of receiving the external data begins with the detection of the falling edge of the $\overline{RAS}$ signal. So, most of the memory systems using memory devices are designed to begin their operation using the falling edge of the $\overline{RAS}$ signal as their starting signals. Therefore, a rather complicated process is necessary in order to make the $\overline{CAS}$ signal become L level before the $\overline{RAS}$ signal becomes L level, without disturbing the operation of the circuits.

On the other hand, total access time of a usual memory device is approximately 100 n.sec. So, the set up time of 20-30 n.sec. occupies a major portion of the total access time of the memory system. Therefore, the problem of how to reduce the set up time is important in order to reduce the access time of a memory system.

SUMMARY OF THE INVENTION

A general object of the present invention, therefore, is to reduce the access time of a memory system using semiconductor dynamic memory devices, and to improve the operation cycle time of computers or data processors employing the dynamic memory devices.

In order to attain the foregoing object, a dynamic memory device of the present invention does not operate its associated circuitry in sequence, but rather operates the circuitry in parallel.

Therefore, the present invention is provided with two address buffers. Each of these address buffer memories is exclusively used to latch the external address or the refresh address respectively, and are designated as external address buffer and refresh address buffer respectively.

These address buffers are respectively composed of a preamplifier and a driver. The preamplifier of the external address buffer is supplied with the external address signal, and the preamplifier of the refresh address buffer is supplied with the refresh address signal. These preamplifiers are enabled by the falling edge of the $\overline{RAS}$ signal, but their output drivers are still not enabled.

Normally, as mentioned above, the falling edge of the $\overline{CAS}$ signal appears after the $\overline{RAS}$ signal has become low level L. So, the $\overline{CAS}$ before $\overline{RAS}$ detector discriminates this, and generates an external address driving signal ADE to the driver of the external address buffer to enable it. Therefore, normally the external address signal is sent from the driver of the external address buffer to the address decoder, and the read out operation of the stored data in the memory cell or writing operation of the external data into the memory cell is performed.

If the $\overline{CAS}$ before $\overline{RAS}$ detector detects the falling edge of the $\overline{CAS}$ signal before the falling edge of the $\overline{RAS}$, it sends an internal address driving signal ADI to the driver of the refresh address buffer to enable it. Therefore, the refresh address is sent from the driver of the refresh address buffer to the address decoder, and the data stored in the memory cell is refreshed.

After such operation of access or refreshing, the $\overline{CAS}$ before $\overline{RAS}$ detector is reset by the rising edge of the $\overline{RAS}$ signal, and the ADE and ADI signals are set to the low level. Thus, the drivers of the external and the refresh address buffers are disabled, and the circuit returns to a standby state.

Using the above configuration, the sequential processes of sending out the refresh signal, switching the circuit from external to refresh address, and enabling the address buffer which occupied a major portion of prior art refreshing time has been eliminated. Thus, the set up time is reduced very substantially. Moreover, since the preamplifiers of the external and the refresh address buffers are enabled beforehand by the falling edge of the $\overline{RAS}$ signal, they are already in a standby state before the ADE or ADI signals are sent from the $\overline{CAS}$ before $\overline{RAS}$ detector. Thus, as soon as the ADE or ADI signal is sent, the driver of the external or refresh address buffer sends the corresponding address signals to the address decoder. The set up time of the drivers becomes much shorter than that or ordinary address buffers, and therefore, the set up time is further reduced.

Therefore, in the refresh circuit of the present invention, it is unnecessary to advance the falling edge of the $\overline{CAS}$ signal as much as in the prior art circuit. In practice, an advancement that is equivalent to a delay time for only one gate is enough to control the refresh cycle. Thus, the set up time is reduced to a greater extent.

Further objects and advantages of the present invention will be apparent from the following description, reference being made to the accompanying drawings wherein preferred embodiments of the present invention are clearly shown.

DETAILED DESCRIPTION OF THE PREFERRED EMBODIMENT

Figure 3:
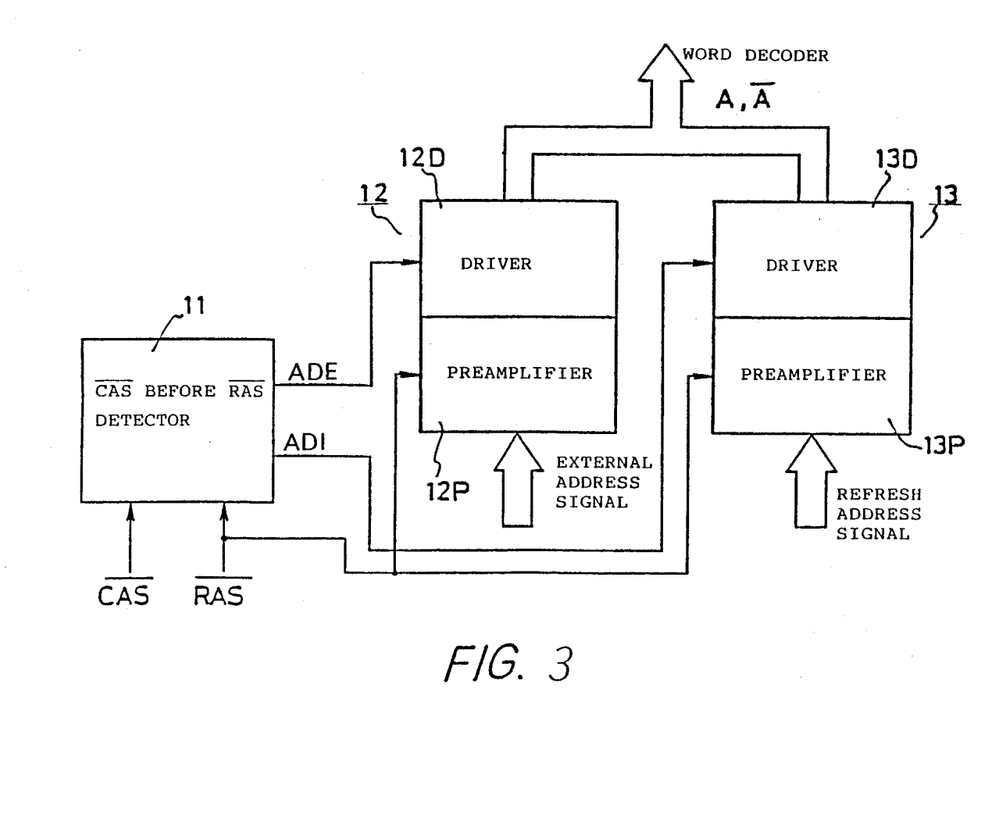
FIG. 3 is a block diagram showing a circuit configuration of a main portion of a dynamic memory device embodying the present invention.
Figure 4:
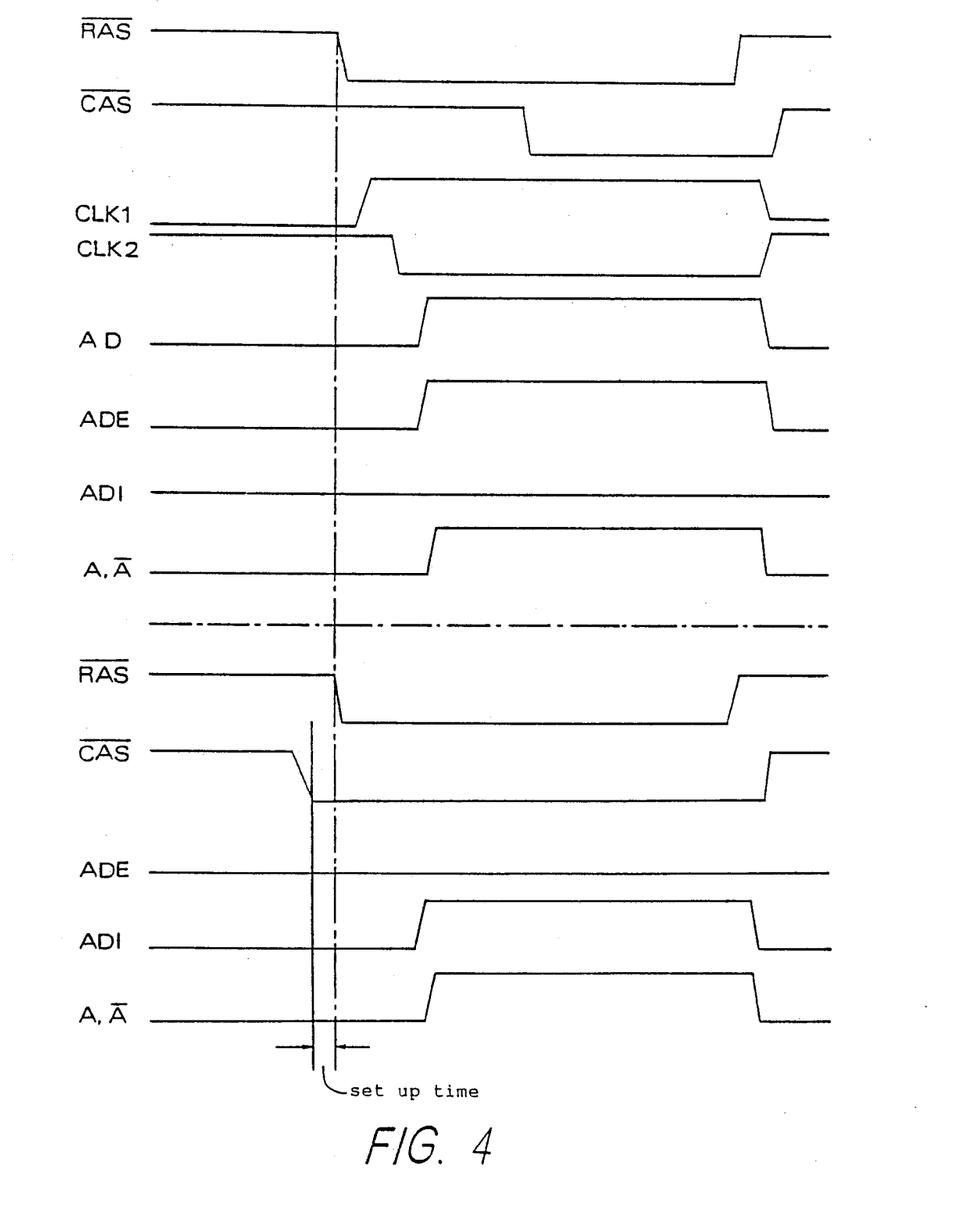
FIG. 4 is a time chart illustrating the operation-time relation between various portions of the circuit of FIG. 3.

FIG. 3 shows a circuit configuration of a main portion of a dynamic memory device of the present invention, and FIG. 4 illustrates the operation timing of various parts of the circuit. Compared to the prior art circuit shown in FIG. 1, the dynamic memory device of the present invention is provided with two address buffer memories 12 and 13. The address buffer memory 12 is used exclusively for external address signals, and is designated the external address buffer. The buffer memory 13 is used exclusively for refresh address signals, and is designated refresh address buffer.

The external address buffer 12 and refresh address buffer 13 are respectively composed of a preamplifier 12P or 13P and a driver 12D or 13D respectively. An external address signal from an external circuit is supplied to the preamplifier 12P. A refresh address signal generated by a refresh address counter (not shown, but similar to one used for prior art dynamic memory circuits) is supplied to the preamplifier 13P. The preamplifier 12P and 13P are also supplied with the $\overline{RAS}$ signal. When the $\overline{RAS}$ signal becomes low level, the preamplifiers are enabled and amplify respective input signals to the level of their source voltage. But the driver 12D and 13D are still disabled, so no output signal appears from the external address buffer 12 or refresh address buffer 13.

In the figure, a $\overline{CAS}$ before $\overline{RAS}$ detector 11 detects the level of the $\overline{CAS}$ signal when the $\overline{RAS}$ signal becomes low level, and discriminates whether the $\overline{CAS}$ signal is in H or L level. In normal operation, the dynamic memory device is sending stored data to an external circuit or receiving data from an external circuit to rewrite the data stored with a new data. But when it is time to refresh, the dynamic memory device refreshes the stored data.

During the normal operation, the external circuit sends a $\overline{CAS}$ signal which becomes low level L, after the $\overline{RAS}$ signal has become low level L as shown in FIG. 4. In FIG. 4, the time relationships above the horizontal dashed line illustrate a normal operation, and the time relationship shown below the horizontal dashed line illustrate a refresh operation. In such normal operation, the $\overline{CAS}$ before $\overline{RAS}$ detector 11 discriminates that the $\overline{CAS}$ signal is low level when the $\overline{RAS}$ signal became low level, and sends an external address driving signal ADE to the driver 12D of the external address signal buffer 12 to enable it. The external address signal is amplified to have enough power to drive the following circuits, and is sent to the word decoder (not shown) as A and $\overline{A}$ signals shown in FIG. 3. The following operations are similar to that of the prior art circuit described with regard to FIGS. 1 and 2, so, further description is omitted for the sake of simplicity.

As shown in FIG. 4, when the $\overline{RAS}$ signal becomes high level H, the ADE signal is reset to the low level, and the circuit returns to a stand by state.

When it is time to refresh, the falling edge of the $\overline{CAS}$ signal is advanced so that the $\overline{CAS}$ signal becomes low level L a little before the $\overline{RAS}$ signals becomes low level L. The control of the $\overline{CAS}$ signal is effected by an external circuit using a delay circuit or varying a counting rate of a clock pulse. As shown in FIG. 4, the advancement of the falling edges of the $\overline{CAS}$ signal may be very small as compared to that required for prior art circuit. Though the figure shows the advancement of the $\overline{CAS}$ signal rather exaggerated, 1-2 n.sec. may be sufficient.

When the $\overline{CAS}$ before $\overline{RAS}$ detector 11 discriminates and detects the falling edge of the $\overline{CAS}$ signal before the $\overline{RAS}$ signal, it sends an internal address driving signal ADI to the driver 13D of the refresh address buffer 13. The refresh address signal is sent to the word decoder (not shown) as A and $\overline{A}$ signals as shown in FIG. 3, and the refreshing of the stored data is performed. When the $\overline{RAS}$ signal become high level H, the ADI signal is reset to a low level L and the circuit returns to a stand by state.

As can be seen from the above description, the total operation of the dynamic memory device of the present invention is very simple. The most important thing to do is to discriminate whether the $\overline{CAS}$ signal is H or L level when the $\overline{RAS}$ signal become L level.

Figure 5:
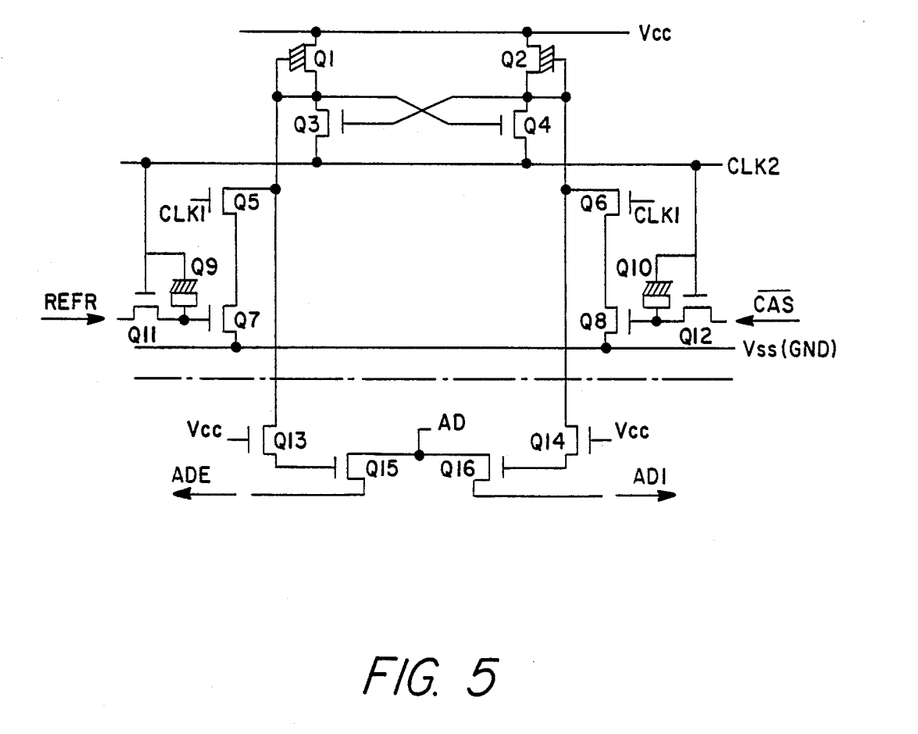
FIG. 5 is a circuit diagram of a main portion of the $\overline{CAS}$ before $\overline{RAS}$ detector used in the present invention.

FIG. 5 is a circuit diagram illustrating a main portion of a $\overline{CAS}$ before $\overline{RAS}$ detector used in an embodiment of the present invention. In the figure, the portion above the horizontal dashed line shows a preamplifier, and the portion below the dashed line shows an output stage of the $\overline{CAS}$ before $\overline{RAS}$ detector. Q1-Q16 designate transistors, among which the hatched ones Q1, Q2, Q9 and Q10 are depletion type FETs (field effect transistors)

and the other ones are all enhancement FETs. The FETs Q3 and Q4 compose a flip-flop circuit, and Q1 and Q2 operate as load resistors. Sources and drains of the FETs Q9 and Q10 are respectively connected to each other. Vcc and Vss designate respectively a positive and negative voltage source. Usually, Vss is grounded. The $\overline{CAS}$ signal is supplied to Q12, and a reference voltage REFR is supplied to Q11.

The circuit is controlled by two control signals CLK1, CLK2 and an address driving signal AD. These control signals are generated coincident to the falling edge of the $\overline{RAS}$ signal. As can be seen in FIG. 4, the falling edge of the second control signal CLK2 is delayed a little behind to that of the CLK1, and the rising edge of the address driving signal AD is further delayed. The control signal CLK1 is supplied to the gates of Q5 and Q6. Sources of Q3 and Q4, and gates of Q9, Q10, Q11 and Q12 are connected to each other and supplied with a second driving signal CLK2. The address driving signal Ad is fed to Q15 and Q16 as shown in FIG. 5. Generation of such signals and their timing are controlled by a clock pulse using a conventional circuit. This is very common in the art, so, further description is omitted for the sake of simplicity.

Operation of the circuit is as follows. First, in a standby state, the CLK1 is at a low level and CLK2 is at a high level as shown in the time chart of FIG. 4. Thus, the $\overline{CAS}$ signal and a reference voltage REFR are respectively supplied to Q8 and Q7 via Q10 and Q9. Since the gates of Q5 and Q6 are at a low level, Q5 and Q6 are cut off so the circuit is still disabled. When the falling edge of the $\overline{RAS}$ signal is detected, the control signal CLK1 becomes H, and the circuit is then enabled. However, since CLK2 is still at a high level, operation of the flip-flop circuit Q3 and Q4 is suppressed.

The $\overline{CAS}$ signal is compared with a reference voltage REFR to distinguish whether it is at a H or L level. The reference voltage REFR is 1.5 volts for example. When the CLK2 signal becomes L, the flip-flop circuit of Q3 and Q4 discriminates a voltage difference between the $\overline{CAS}$ signal and REFR, and discharges one of the gates of Q15 or Q16 to L, and discharges the gate of the other one to L according to the direction of the voltage difference. At the same time, Q11 and Q12 are cut off. Thus, the charge in gates of Q7 and Q8 are clamped. This protects Q7 and Q8 from malfunction caused by fluctuation of circuit voltages. Such a circuit is well known and often used in the art, so further description is omitted.

If the $\overline{CAS}$ signal is lower than the reference voltage, that is at an L level, current running through Q7 is larger than that in Q8. This voltage difference is detected by the flip-flop circuit of Q3 and Q4. Thus, the gate of Q15 becomes L, and gate of Q16 become H. At this time, if the address driving signal AD is supplied to the drains of Q15 and Q16, a signal will appear from the source of Q16, indicating that $\overline{CAS}$ was already L when the $\overline{RAS}$ signal became L. This means $\overline{CAS}$ has become L before $\overline{RAS}$ becomes L, so the signal from Q16 is the ADI signal. It will be clear that if the $\overline{CAS}$ signal is higher than the REFR, the ADE signal is supplied from Q15. The ADE and ADI signals are supplied respectively to the drivers 12D and 13D as shown in FIG. 3.

When the $\overline{RAS}$ signal becomes H, CLK1 is pulled down to L level, and CLK2 is pulled up to H level and the circuit returns to the standby state.

Figure 6:
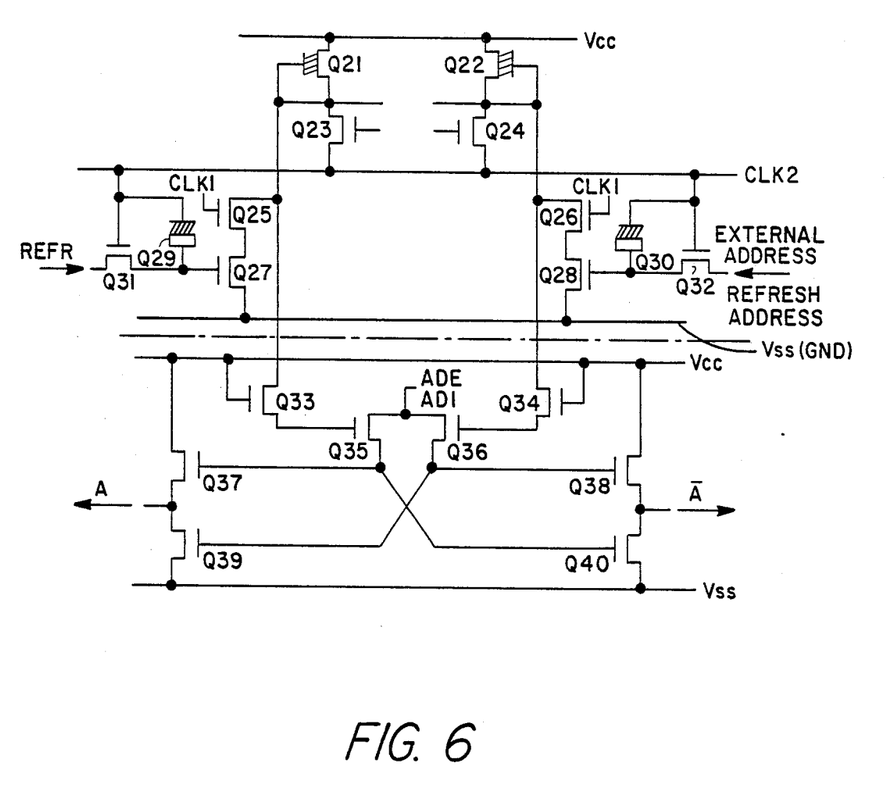
FIG. 6 is a circuit diagram of a main portion of the address buffer used in the present invention.

FIG. 6 is a circuit diagram for an address buffer applicable for both the external address buffer 12 and the refresh address buffer 13 shown in FIG. 4. The portion of the diagram above the horizontal dashed line corresponds to the preamplifier 12P or 13P, and the portion of the diagram below the horizontal dashed line corresponds to the driver 12D or 13D.

In the figure, Q21–Q40 are FETs, in which the hatched FETs are depletion type FETs and the others are enhancement type FETs. Other reference symbols or characters designate same or similar elements to those of FIG. 5. It will be apparent that, the circuit above the horizontal dashed line is very similar to that of FIG. 5, except that the $\overline{CAS}$ signal is replaced by the external address signal or refresh address signal, and the AD signal is replaced by the address driving signals ADE or ADI. The circuit is controlled by CLK1 and CLK2 signals, in a similar manner to that described with respect to FIG. 5. Therefore, it will be clear, that when CLK1 and CLK2 are H, the address signal and its inverse will appear from the sources of Q35 and Q36. Compared to the circuit of FIG. 5, the output circuit of the FIG. 6 is provided with an output circuit comprising Q37–Q39 and Q38–Q40. Thus, if the ADE or ADI signal is applied to the drain of Q35 and Q36, the A or $\overline{A}$ signals are sent out to the address decoder.

It will be clear from the above explanation, that the $\overline{CAS}$ before $\overline{RAS}$ detector 11 and the preamplifiers of the address buffers 12 and 13 are enabled at the same time by the falling edge of the $\overline{RAS}$ signal, so that they begin to operate in parallel to each other. This results in a substantial contrast to sequential operation of prior art circuit, and this is the main feature of the present invention to improve the set up time. While the $\overline{CAS}$ before $\overline{RAS}$ detector is discriminating the timing of falling edges, the preamplifier 12P or 13P amplifies the address signals, and the output driver circuits 12D and 13D are set ready to send the signals. As soon as the AD signals arrive, the driver sends out the address signal to the word decoder.

In one embodiment of the present invention, the set up time of a dynamic memory device has been reduced to approximately 1–2 n.sec. as compared to that of 23–30 n.sec. of the prior art circuit. Thus, the cycle time of a computer or data processor using dynamic memory devices can be reduced to a great extent.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

We claim:

1. A semiconductor dynamic memory device having read/write and refreshing operations controlled by $\overline{RAS}$ and $\overline{CAS}$ signals applied from external circuits, comprising:
   a memory cell array for storing data;
   a word decoder for decoding an address signal applied thereto and selecting word lines of said memory array;
   a refresh address counter for generating a refresh address signal;
   a $\overline{CAS}$ before $\overline{RAS}$ detector means, for detecting the levels of the $\overline{CAS}$ signal and $\overline{RAS}$ signal applied to said memory device, and for providing an external address driving signal ADE when it discriminates that the $\overline{CAS}$ signal is high level when the $\overline{RAS}$ signal becomes low level, and for providing a refresh address driving signal ADI when it discriminates that the $\overline{CAS}$ signal is low level when the $\overline{RAS}$ signal becomes low level;
   an external address buffer means, coupled to said detector means, for latching an external address sent to the dynamic memory device from the external circuit, and sending the latched address to said word decoder when said address buffer means receives the ADE signal; and
   a refresh address buffer means, coupled to said detector means in parallel with said external address buffer means, for latching the refresh address generated by said refresh address counter and sending the latched address to said word decoder when said refresh address buffer means receives the ADI signal,
   wherein said external address and said refresh addresses are simultaneously processed in parallel in said external address buffer means and said refresh address buffer means respectively, such that one of said external address or said refresh address can be immediately applied to said word decoder in response to one of said ADE or ADI signals respectively.

2. A semiconductor dynamic memory device according to claim 1, wherein said external address buffer means and said refresh address buffer means are reset when the $\overline{RAS}$ signal becomes high level.

3. A semiconductor dynamic memory device according to claim 1, wherein said $\overline{CAS}$ before $\overline{RAS}$ detector means comprises:
   a preamplifier stage which is enabled when the CLK1 signal becomes high level, and discriminates a voltage difference between the $\overline{CAS}$ signal and a predetermined reference voltage when the CLK2 signal becomes low level; and
   an output means for generating the ADE or ADI signals when it receives the AD signal, said output means generating ADE signal when said preamplifier discriminates that the $\overline{CAS}$ signal is higher than the reference voltage, and generating the ADI signal when said preamplifier discriminates that the $\overline{CAS}$ signal is lower than the reference voltage when the $\overline{RAS}$ signal becomes low level.

4. A semiconductor dynamic memory device according to claim 1, wherein said external address buffer means comprises:
   a first preamplifier means for amplifying the external address signals applied to the memory device; and
   a first driver means for sending the external address signals amplified by said first preamplifier means to said word decoder when said first driver receives the ADE signal.

5. A semiconductor dynamic memory device according to claim 4, wherein,
   said first preamplifier means is enabled when the CLK1 signal becomes high level, and discriminates a voltage difference between the external address signal supplied thereto, and a predetermined reference voltage when the CLK2 signal becomes low level, and said first preamplifier means is reset when the $\overline{RAS}$ signal becomes high level.

6. A semiconductor dynamic memory device according to claim 1, wherein said refresh address buffer means comprises:

a second preamplifier means for amplifying the refresh address signals generated by said refresh address counter; and a second driver means for sending the refresh address signals amplified by said second preamplifier means to said word decoder when said second driver receives the ADI signal.

7. A semiconductor dynamic memory device according to claim 6, wherein, said second preamplifier means is enabled when the CLK1 signal becomes high level, and discriminates a voltage difference between the refresh address signal supplied thereto and a predetermined reference voltage when the CLK2 signal becomes low level, and said second preamplifier means is reset when the $\overline{\text{RAS}}$ signal becomes high level.

* * * * *